(12) United States Patent
Tilhonen et al.

(10) Patent No.: US 8,203,346 B2
(45) Date of Patent: Jun. 19, 2012

(54) METHOD AND APPARATUS FOR DETECTING GROUND FAULT

(75) Inventors: Vesa Tilhonen, Beijing (CN); Pekka Varis, Espoo (FI)

(73) Assignee: ABB Oy, Helsinki (FI)

( * ) Notice: Subject to any disclaimer, the term of this patent is extended or adjusted under 35 U.S.C. 154(b) by 591 days.

(21) Appl. No.: 12/338,461

(22) Filed: Dec. 18, 2008

(65) Prior Publication Data

US 2009/0160453 A1 Jun. 25, 2009

(30) Foreign Application Priority Data

Dec. 20, 2007 (FI) .................................. 20075946

(51) Int. Cl.
*G01R 31/14* (2006.01)
*H02H 9/08* (2006.01)
(52) U.S. Cl. ........................................ 324/509; 361/42
(58) Field of Classification Search .................. 324/509; 361/42
See application file for complete search history.

(56) References Cited

U.S. PATENT DOCUMENTS

| | | | | | |
|---|---|---|---|---|---|
| 4,203,142 | A | * | 5/1980 | Lee | 361/42 |
| 4,398,232 | A | * | 8/1983 | Elmore | 361/47 |
| 4,953,054 | A | * | 8/1990 | Fetzer et al. | 361/45 |
| 5,214,575 | A | | 5/1993 | Sugishima et al. | |
| 5,428,549 | A | * | 6/1995 | Chen | 702/59 |
| 5,483,167 | A | | 1/1996 | Mikami | |
| 5,512,883 | A | * | 4/1996 | Lane, Jr. | 340/648 |
| 5,783,946 | A | * | 7/1998 | Yang | 324/522 |
| 6,005,393 | A | * | 12/1999 | Baumgartl | 324/509 |
| 6,297,940 | B1 | * | 10/2001 | Wu | 361/79 |
| 6,392,422 | B1 | * | 5/2002 | Kammer et al. | 324/650 |
| 6,407,894 | B1 | * | 6/2002 | Bilac et al. | 361/44 |
| 6,445,141 | B1 | * | 9/2002 | Kastner et al. | 315/307 |
| 6,625,551 | B1 | * | 9/2003 | Gies et al. | 702/58 |
| 6,842,319 | B2 | * | 1/2005 | Mahnert et al. | 361/67 |
| 7,016,174 | B2 | * | 3/2006 | Dougherty | 361/93.1 |
| 7,154,277 | B2 | | 12/2006 | Vallinmaki et al. | |
| 7,233,465 | B2 | * | 6/2007 | Lee | 361/42 |
| 7,355,436 | B2 | * | 4/2008 | Zehentner et al. | 324/765.01 |
| 7,633,729 | B2 | * | 12/2009 | Oldenburg et al. | 361/42 |
| 7,701,356 | B2 | * | 4/2010 | Curt et al. | 340/635 |
| 2003/0011950 | A1 | * | 1/2003 | Steffen | 361/62 |
| 2004/0085074 | A1 | * | 5/2004 | Kereit | 324/512 |
| 2004/0189316 | A1 | | 9/2004 | Kim | |
| 2005/0099743 | A1 | * | 5/2005 | Lee | 361/42 |
| 2006/0198065 | A1 | * | 9/2006 | Guzman-Casillas et al. | 361/35 |
| 2006/0261678 | A1 | * | 11/2006 | Khayat et al. | 307/151 |
| 2007/0279068 | A1 | * | 12/2007 | Harres | 324/522 |
| 2008/0030199 | A1 | * | 2/2008 | Hou | 324/500 |
| 2008/0100976 | A1 | * | 5/2008 | Huczko et al. | 361/79 |
| 2008/0158753 | A1 | * | 7/2008 | Premerlani et al. | 361/80 |

OTHER PUBLICATIONS

Finnish Search Report.

* cited by examiner

*Primary Examiner* — Amy He
(74) *Attorney, Agent, or Firm* — Buchanan Ingersoll & Rooney PC

(57) ABSTRACT

Method and apparatus for detecting a ground fault, the apparatus including diagnostics unit arranged to monitor a sum current of output phases of a frequency converter, diagnostics unit arranged to detect a ground fault, if the sum current exceeds a predetermined threshold value, and diagnostics unit for performing the initial setting of the threshold value, the diagnostic unit being arranged to determine the value of the sum current when the frequency converter starts up and to set the threshold value so that it is greater than the predetermined value of the sum current.

22 Claims, 1 Drawing Sheet

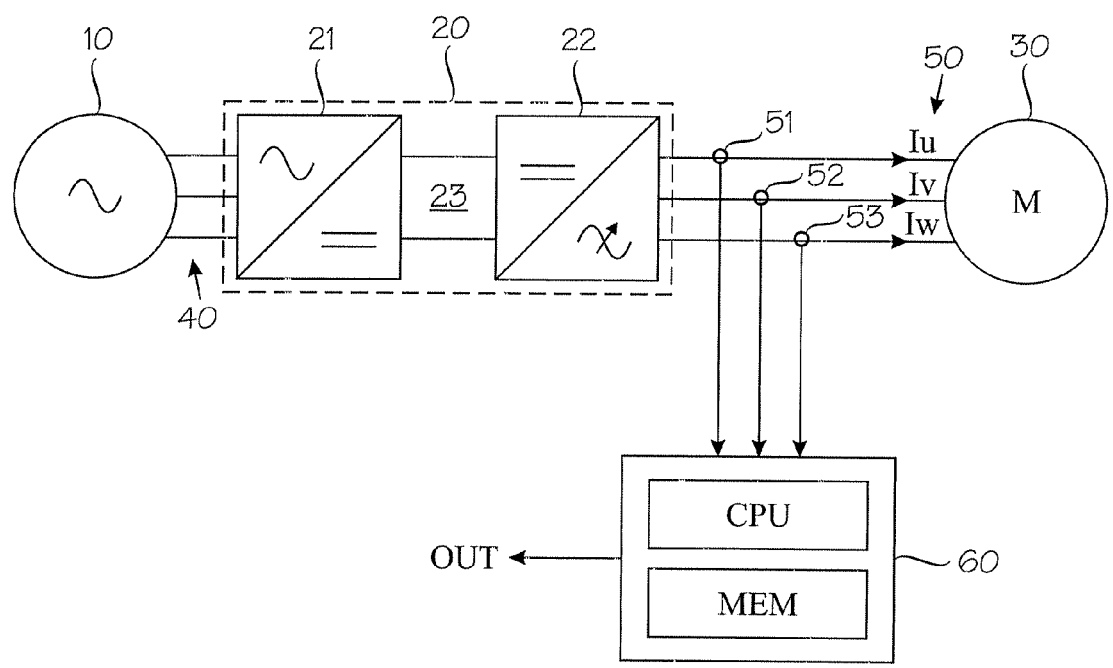

METHOD AND APPARATUS FOR DETECTING GROUND FAULT

FIELD OF THE INVENTION

The invention relates to detecting a ground fault and, in particular, detecting a ground fault at a frequency converter output.

BACKGROUND OF THE INVENTION

A frequency converter is a device, which is typically used for controlling a motor or another load. FIG. 1 shows an example of a frequency converter connection. Typically, the frequency converter 20 consists of two converters, namely, of a rectifier 21 and an inverter 22, between which there is a DC or AC intermediate circuit 23. The rectifier 21 and the inverter 22 may also be located physically apart, and one rectifier may supply a plurality of inverters through the common intermediate circuit 23. An example of the rectifiers 21 is a diode bridge, which is inputted 40 from a DC source 10, which is an AC network of 50 or 60 Hz, for instance, and an example of the inverters 22 is a converter bridge implemented by means of transistors (e.g. IGBT, Insulated-gate Bipolar Transistor) or other semiconductors. The inverter 22 is typically used for controlling the power transferred from the intermediate circuit 23 of the frequency converter to the motor 30. In the FIGURE, the supply connection 50 between the inverter 22 and the motor 30 is a three-phase DC connection, for instance. The inverter allows the motor 30 to be controlled in a reliable manner such that the motor executes accurately a desired speed or torque instruction, for instance.

The frequency converter 20 typically comprises protection diagnostics 50 for ground faults. This may be implemented in the actual frequency converter or by means of an external unit or units. For instance, a one-phase ground fault occurring in a cable between the frequency converter 20 and the motor 30 or in the motor 30 causes a fault current in a network grounded on the input side, which fault current may damage the frequency converter. The function of the ground fault protection is to detect a ground fault situation at the output of the frequency converter, for instance, in the motor supplied by the frequency converter or on the supply connection between them, and to perform an ground fault alert and/or necessary switching operations to protect the frequency converter and the devices connected thereto.

A ground fault situation can be detected by monitoring the sum $I_u+I_v+I_w$ of the output phase currents of the frequency converter, and if it deviates from zero, a ground fault trigger is performed. In an ideal case, the sum of the currents of the output phases is zero in a normal operating situation, because loads do not typically comprise a separate return conductor, but all the current passing to the motor returns along feed conductors. In practice however, the sum of the output phase currents during normal operation is not generally zero, but it deviates to some extent therefrom, depending, for instance, on a high voltage change rate occurring at the frequency converter output, on ground capacitances of the motor and the conductor between the frequency converter and the motor as well as on asymmetry. Consequently, the threshold value of the sum current, whereby a ground fault is detected, must be set to differ from zero. Prior art arrangements for detecting a ground fault have been disclosed in publications U.S. Pat. No. 5,214,575, U.S. Pat. No. 7,154,277 and US 2005/0099743.

A problem with the above-described arrangement is that the deviation of the sum current from zero in a normal operating mode depends on the characteristics of the system, such as the length and type of the conductor between the frequency converter and the motor, and hence the sensibility of ground fault protection is not necessarily the best possible in all systems as a predetermined threshold value for the sum current is employed, if the characteristics of the system are not accurately known as the threshold value is determined.

BRIEF DESCRIPTION OF THE INVENTION

The object of the invention is to provide a method and an apparatus implementing the method such that the above problems may be solved or at least they may be alleviated. This is achieved by a system and a method, which are characterized by what is stated in the independent claims. The preferred embodiments of the invention are disclosed in the dependent claims.

The invention is based on the idea of determining a value of a sum current, when a frequency converter is started, and setting the threshold value of the sum current, whereby a ground fault is detected, to be higher than the value of the sum current determined in startup.

The method and the system of the invention have an advantage that the threshold value of the sum current takes into account the value of sum current deviating from zero occurring in the normal state of the system, whereby an optimal detection sensibility for a ground fault will be achieved.

BRIEF DESCRIPTION OF THE DRAWINGS

In the following, the invention will be described in greater detail in connection with preferred embodiments, with reference to the attached drawings, in which FIG. 1 is a block diagram of a frequency converter connection.

DETAILED DESCRIPTION OF THE INVENTION

The example of a frequency converter connection shown in FIG. 1 is described earlier in the general part of this specification, so it is not repeated herein. It should be noted that the use of the invention is not restricted to any particular type of a frequency converter 20. The type of the load, such as the motor 30, is not relevant either, as regards the basic idea of the invention, but it may be a three- or six-phase squirrel cage induction motor, for instance. Further, the invention is not limited to any voltage level or levels. Likewise, the system, or a part thereof, to which the invention is applied, may be grounded or isolated from ground. It should be noted that the invention relates to detecting a ground fault, whereby it is irrelevant to the basic idea of the invention what further operations will be carried out, if any, when the ground fault is detected.

The functionality of the invention may be implemented, for instance, by means of a fault diagnostics unit 60 or a like element or elements, which may be arranged to detect also other faults apart from ground faults. The diagnostics unit 60 may be a part of the frequency converter 20 or a separate element as shown in FIG. 1. It may also consist of a plurality of separate elements. The diagnostics unit advantageously receives measurement data on the output phase currents $I_u$, $I_v$ and $I_w$ of the frequency converter by means of a suitable measuring arrangement, such as current converters 51, 52, 53. It is also possible to measure directly the sum current $I_u+I_v+I_w$ of the frequency converter output phases and to convey this measurement data to the unit 60. Further, it is possible to arrange monitoring of the sum current of the frequency converter output phases by means of a quantity or quantities proportional thereto. For instance, the measured sum current of the phases may be rectified and filtered, and the obtained current signal may be used for monitoring the sum current in accordance with the various embodiments of the invention.

The diagnostics unit 60 monitors the sum current $I_u+I_v+I_w$ of the frequency converter output phases and detects a ground fault, if the sum current exceeds the predetermined threshold value. The threshold value may be stored in the internal memory MEM of the diagnostics unit 60 or it may be conveyed to the diagnostics unit from another unit, for instance. After the detection of the ground fault the diagnostics unit 60 may perform a ground fault alert and/or necessary switching operations to protect the frequency converter and devices connected thereto. For this purpose, the diagnostics unit 60 advantageously comprises one or more outputs OUT. The diagnostics unit 60 also advantageously comprises a user interface, through which an operator of the system may control settings and operations relating thereto. For the sake of clarity, this is not shown in the FIGURE.

In accordance with an embodiment of the invention, the setting of said sum current threshold value comprises an initial setting, which in turn comprises determination of the value of the sum current $I_u+I_v+I_w$, when the frequency converter is started, and setting the threshold value higher than the determined sum current value. The diagnostics unit 60 is thus advantageously arranged to determine the sum current value, when the frequency converter starts up, and to set the threshold value higher than the determined sum current value. The determination of the sum current value in connection with the startup advantageously takes place at the moment when the current passing to the load has become normalized.

In accordance with an embodiment of the invention, the determination of the sum current value in connection with the initial setting is carried out by measuring. In other words, the diagnostics unit measures the value of the sum current $I_u+I_v+I_w$, by means of a measurement connection shown in FIG. 1, for instance. In accordance with another embodiment of the invention, the determination of the sum current value in connection with the initial setting takes place experimentally by searching for a threshold value, by which a ground fault will be detected. In other words, the threshold value set in the diagnostics unit 60 is altered until a ground fault is detected, i.e. a threshold value is found, which corresponds to the sum current value of the normal state. The threshold value may be altered, for instance, from a low value to a higher one or vice versa using suitable steps.

In accordance with an embodiment of the invention, the initial setting of the threshold value is performed, when the frequency converter is started for the first time. In accordance with another embodiment of the invention the initial setting of the threshold value is performed every time the frequency converter is started. This embodiment is advantageous in a system, where even after the first startup there may occur significant connection changes or other changes that substantially affect the sum current value of the normal state.

In accordance with an embodiment of the invention, in the initial threshold value setting, the threshold value is set about 10 to 90%, and advantageously 40 to 60% higher than the determined sum current value. In accordance with an embodiment of the invention, in the initial threshold value setting, the threshold value is set about 50% higher than the determined sum current value.

Because it is possible that, due to an erroneous switching or the like, the system already involves a ground fault prior to the first startup, it is advantageous that the initial threshold value setting detects a ground fault, if the determined sum current value exceeds the predetermined maximum value. In other words, the system is provided in advance with a particular sum current maximum value, and the exceeding of that value refers that a ground fault is involved.

In accordance with an embodiment of the invention, the setting of the sum current threshold value further comprises a correction of the set threshold value as a function of the switching frequency and/or the DC voltage of the frequency converter. In accordance with this embodiment the ready set threshold value may be corrected as the frequency converter is in operation, when the switching frequency of the frequency converter and/or the DC voltage of the intermediate circuit changes. Adaptive threshold value setting of this kind is particularly useful in a network isolated from ground. In a network isolated from ground the ground fault only affects capacitive leakage currents, which appear at a frequency converter output even in a normal case, due to high rate of voltage change, ground capacitances of the motor cable and the motor as well as asymmetry. In a ground fault, impedance seen by an offset current passing through a ground level is reduced, which increases these short current spikes. On the basis of this a ground fault must be discerned.

In the network isolated from ground, the quantities affecting the magnitude of the leakage current include:

1. impedance of a sum current route (this is affected by a ground fault, if any, in a cable; the type and length of a motor cable, capacitance of the supplying network and network capacitors mounted between ground and phases), 2. rate of voltage rise, which is defined in accordance with the frequency converter employed, 3. DC voltage level, which mainly affects the duration of a current spike produced in each switching, and 4. switching frequency, which mainly affects the frequency of occurrence of current spikes.

In the initial setting, it is advantageous to set the threshold value higher than the measured leakage currents such that changes of reasonable magnitude in the supplying network are possible. In practice, this requires a margin of about 50% as stated above. The type or length of the motor cable seldom changes after introduction into use. Likewise, the rate of voltage rise typically remains the same for the whole service life of the frequency converter.

The switching frequency of the frequency converter is known and the DC voltage level of the intermediate circuit may be measured. By means of these quantities it is possible to correct the threshold value, in particular in a network isolated from ground. The magnitude of the necessary correction depends on the characteristics of the system. For instance, if filtration of a rectified sum current signal is selected such that a capacitive leakage current caused by a single switching raises the current signal in the order directly proportional to the network voltage, the threshold value is to be advantageously increased correspondingly, i.e. to be proportional to the intermediate circuit voltage. If the sum current signal of the measurement switching is zeroed so fast in comparison to the highest switching frequency that the preceding switching no longer affects the sum current signal of the subsequent switching, the threshold value need not be compensated in that case at all according to the switching frequency. The adaptive threshold value setting of the invention works with various values of sum current signal filtration; generally speaking, at its most the threshold value compensation may be directly proportional to the voltage of the intermediate circuit and directly proportional to the switching frequency.

The apparatus of the invention may be implemented by means of one or more units. The apparatus may comprise, for instance, a unit for monitoring the sum current of frequency converter output phases, a unit for detecting a ground fault and a unit for performing an initial setting of a threshold value in accordance with the above embodiments of the invention. The term "unit" generally refers to a physical or logic whole, such as a physical device or a part thereof or a software routine. Other above-described embodiments of the invention may be implemented, for instance, by means of said units or one or more additional units. The units may be physically separate or implemented as an integrated whole, such as a fault diagnostics unit 60, for instance.

The apparatus in accordance with the embodiments of the invention may be implemented by means of a computer or a corresponding signal processing apparatus comprising suitable software. The computer or the signal processing apparatus of this kind advantageously comprises at least a memory MEM, which provides a storing area that arithmetical operations utilize, and a processor CPU, such as a general-purpose digital signal processor (DSP), which carries out the arithmetical operations. It is also possible to use specific integrated circuits or other components and devices for implementing the functionality of the invention.

The invention may be implemented in existing systems such as frequency converters, or it is possible to use separate elements and devices in a centralized manner or in a distributed manner. The existing devices such as the frequency converters typically comprise a processor and a memory, which may be utilized for implementing the functionality of the invention. Hence, all the changes and configurations required for the implementation of the embodiments of the invention may be performed by means of software routines, which in turn may be implemented as supplemented or updated software routines. If the functionality of the invention is implemented by means of software, this software may be provided as a computer program product which comprises a computer program code, the execution of which on the computer makes the computer or the like apparatus execute the functionality of the invention in accordance with what is described above. This computer program code may be stored on a computer-readable medium such as a suitable memory means, e.g. a flash memory or disk storage, wherefrom it is readable to a unit or units that perform the program code. In addition, this program code may be uploaded in a unit or units that perform the program code via a suitable data network and it may replace or update the existing program code, if any.

It is apparent to a person skilled in the art that as technology advances the basic idea of the invention may be implemented in a variety of ways. Thus, the invention and the details thereof are not restricted to the above-described examples, but they may vary within the scope of the claims.

The invention claimed is:

1. A ground fault detecting device, the device being configured:
   to monitor a sum current of output phases of a frequency converter;
   to detect a ground fault, if the sum current exceeds a set threshold value; and
   to perform an initial setting of the threshold value by determining a sum current value, when the frequency converter starts up, and by setting the threshold value higher than the determined sum current value.

2. The device of claim 1, wherein the device is configured to perform the initial setting of the threshold value when the frequency converter starts up for the first time.

3. The device of claim 1, wherein the device is configured to perform the initial setting of the threshold value every time the frequency converter starts up.

4. The device of claim 1, wherein the device is configured to set the threshold value in the initial setting of the threshold value to be 40 to 60% higher than the determined sum current value.

5. The device of claim 4, wherein the device is configured to set the threshold value in the initial setting of the threshold value to be 50% higher than the determined sum current value.

6. The device of claim 1, wherein the device is configured to detect a ground fault, if the value of the sum current determined in the initial setting of the threshold value exceeds a predetermined maximum value.

7. The device of claim 1, wherein the device is configured to correct the set threshold value as a function of at least one of a switching frequency and a DC voltage of the frequency converter.

8. The device of claim 1, wherein the device is configured to monitor the sum current of the output phases of the frequency converter by means of a quantity or quantities proportional thereto.

9. The device of claim 1, wherein the device comprises a frequency converter.

10. The device of claim 9, wherein the frequency converter is configured to supply one or more motors.

11. A method for detecting a ground fault, the method comprising:
    monitoring a sum current of output phases of a frequency converter;
    performing an initial setting of a threshold value, said initial setting including determining a sum current value, when the frequency converter is started, and setting the threshold value higher than the determined sum current value; and
    detecting a ground fault, if the monitored sum current exceeds the set threshold value.

12. The method of claim 11, wherein the initial setting of the threshold value is performed, when the frequency converter is started for the first time.

13. The method of claim 11, wherein the initial setting of the threshold value is performed every time the frequency converter is started.

14. The method of claim 11, wherein the threshold value in the initial setting of the threshold value is set to be 40 to 60% higher than the determined sum current value.

15. The method of claim 14, wherein the threshold value in the initial setting of the threshold value is set to be 50% higher than the determined sum current value.

16. The method of claim 11, wherein said sum current value is determined by measuring.

17. The method of claim 11, wherein said sum current value is determined experimentally by searching for a threshold value, by which the detection of a ground fault takes place.

18. The method of claim 11, wherein the initial setting of a threshold value comprises:
    detecting a ground fault, if the determined sum current value exceeds the predetermined maximum value.

19. The method of claim 11, the method comprising:
    correcting the set threshold value as a function of at least one of a switching frequency and a DC voltage of the frequency converter.

20. The method of claim 11, wherein the monitoring of the sum current of the output phases of the frequency converter is performed by means of a quantity or quantities proportional thereto.

21. A computer program product embodied on a non-transitory computer-readable medium comprising a computer program code, the execution of which on a computer makes the computer perform the steps of the method of claim 11.

22. An apparatus for detecting a ground fault, the apparatus comprising:
    means arranged for monitoring a sum current of output phases of a frequency converter;
    means arranged for detecting a ground fault, if the sum current exceeds a set threshold value; and
    means for performing an initial setting of the threshold value, which means are arranged for determining a sum current value, when the frequency converter starts up, and for setting the threshold value higher than the determined sum current value.

* * * * *